United States Patent
Noh et al.

(10) Patent No.: US 8,674,359 B2
(45) Date of Patent: Mar. 18, 2014

(54) TFT, ARRAY SUBSTRATE FOR DISPLAY APPARATUS INCLUDING TFT, AND METHODS OF MANUFACTURING TFT AND ARRAY SUBSTRATE

(75) Inventors: Dae-Hyun Noh, Yongin (KR); Sung-Ho Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 289 days.

(21) Appl. No.: 13/079,611

(22) Filed: Apr. 4, 2011

(65) Prior Publication Data

US 2011/0303923 A1 Dec. 15, 2011

(30) Foreign Application Priority Data

Jun. 9, 2010 (KR) ........................ 10-2010-0054504

(51) Int. Cl.
*H01L 29/04* (2006.01)
*H01L 29/10* (2006.01)
*H01L 31/00* (2006.01)

(52) U.S. Cl.
USPC ............ 257/57; 257/59; 257/204; 257/223; 257/227; 257/291; 257/347; 257/412; 257/E21.134; 257/21.212; 257/E21.414; 257/E29.003; 438/51; 438/149; 438/166; 438/197; 438/795; 438/798

(58) Field of Classification Search
USPC .......... 257/204, 223, 227, 291, 347, 412, 57, 257/59, E21.134, E21.212, E21.414, 257/E29.003; 438/149, 51, 166, 197, 795, 438/798
See application file for complete search history.

(56) References Cited

U.S. PATENT DOCUMENTS

| 6,596,573 | B2 | 7/2003 | Lee et al. | |
| 2006/0097261 | A1* | 5/2006 | Yang | ............................... 257/66 |
| 2006/0145162 | A1 | 7/2006 | Yang | |
| 2007/0155080 | A1 | 7/2007 | Yoon | |
| 2008/0099764 | A1 | 5/2008 | Choi et al. | |
| 2008/0191207 | A1* | 8/2008 | Nishiura | ......................... 257/59 |
| 2008/0277658 | A1 | 11/2008 | Lee et al. | |

(Continued)

FOREIGN PATENT DOCUMENTS

| JP | 2006229026 A | 8/2006 |
| JP | 2006287084 A | 10/2006 |

(Continued)

OTHER PUBLICATIONS

Korean Office action issued on Jul. 28, 2011 (Korean Paten Application No. 10-2010-0054504), and "Request for Entry of the Prior Art References" submitted herewith.

(Continued)

*Primary Examiner* — Meiya Li
(74) *Attorney, Agent, or Firm* — Robert E. Bushnell, Esq.

(57) ABSTRACT

A thin film transistor (TFT), an array substrate including the TFT, and methods of manufacturing the TFT and the array substrate. The TFT includes an active layer, and a metal member that corresponds to a portion of each of the source region and the drain region of the active layer, and is arranged on the active layer, a portion of the metal member contacts the source and drain regions of the active layer and the source and drain electrodes, and portions of the active layer that corresponds to portions below the metal member of the active layer are not doped.

19 Claims, 9 Drawing Sheets

(56) References Cited

U.S. PATENT DOCUMENTS

| | | |
|---|---|---|
| 2009/0315026 A1 | 12/2009 | Jeong et al. |
| 2010/0044712 A1 | 2/2010 | Heo et al. |
| 2010/0140613 A1* | 6/2010 | Kimura .......................... 257/43 |

FOREIGN PATENT DOCUMENTS

| | | |
|---|---|---|
| JP | 2007324534 A | 12/2007 |
| KR | 20020033373 A | 5/2002 |
| KR | 10-2006-0073771 A | 6/2006 |
| KR | 1020060077895 | 7/2006 |
| KR | 10-2008-0074729 A | 8/2008 |

OTHER PUBLICATIONS

English Translation of Korean Notice of Allowance issued by KIPO, on Dec. 26, 2011, corresponding to KR 10-2010-0054504.

* cited by examiner

TFT, ARRAY SUBSTRATE FOR DISPLAY APPARATUS INCLUDING TFT, AND METHODS OF MANUFACTURING TFT AND ARRAY SUBSTRATE

CLAIM OF PRIORITY

This application makes reference to, incorporates the same herein, and claims all benefits accruing under 35 U.S.C. §119 from an application earlier filed in the Korean Intellectual Property Office on Jun. 9, 2010 and there duly assigned Serial No. 10-2010-0054504

BACKGROUND OF THE INVENTION

1. Field of the Invention

The present invention relates to thin film transistors (TFTs) for easily realizing a large size display apparatus, array substrates including the TFTs and a method of manufacturing the same.

2. Description of the Related Art

A flat display apparatus, such as an organic light emitting display apparatus and a liquid crystal display (LCD) apparatus, is manufactured on a substrate on which a thin film transistor (TFT), a capacitor, and patterns including wirings for connecting the TFT and the capacitor are formed. The TFT is used as a switching device for switching signals provided through wires disposed on the substrate to control an operation of each pixel, and as a driving device for driving a pixel.

Generally, a TFT includes an active layer including source and drain regions that are doped with high concentration impurities, and a channel region that is formed between the source and the drain regions. In addition, the TFT includes a gate electrode that is insulated from the active layer and is positioned to correspond to the channel region, and source and drain electrodes that contact the source and drain regions, respectively.

SUMMARY OF THE INVENTION

Aspects of the present invention provide thin film transistors (TFTs) for easily realizing a large size display apparatus, array substrates including the TFTs and a method of manufacturing the same.

According to an aspect of the present invention, there is provided a thin film transistor (TFT) including an active layer including a source region, a drain region, and a channel region, the active layer including a plurality of doped regions and at least one undoped region, a first metal member arranged on the active layer to correspond to a portion of each of the source region and the drain region, an upper insulating layer arranged on the first metal member, the upper insulating layer being perforated by a pair of contact holes that expose portions of the first metal member, a gate electrode arranged to correspond to the channel region of the active layer and a second metal member to electrically connect each of the source region and the drain region to an external element.

A portion of the active layer that corresponds to the first metal member may be one of the at least one undoped regions. A portion of the active layer that corresponds to the gate electrode may be one of the at least one undoped regions. The second metal member may contact the exposed portions of the first metal member, and the second metal member may fill and cover each of the contact holes. The first metal member may include one of molybdenum (Mo), titanium (Ti) and a Mo—Ti alloy. The first metal member may include a same material as the second metal member. The active layer may include polysilicon. The gate electrode may include a first gate electrode that includes a transparent conductive material and a second gate electrode arranged on the first gate electrode.

According to another aspect of the present invention, there is provided an array substrate of a display apparatus that includes a thin film transistor (TFT) that includes a first active layer arranged on the array substrate, the first active layer including a source region, a drain region and a channel region, the first active layer includes a plurality of doped regions and at least one undoped region, a metal member arranged on the first active layer at a location that corresponds to each of the source region and the drain region, an upper insulating layer arranged on the metal member, the upper insulating layer being perforated by a pair of contact holes that exposes portions of the metal member, a gate electrode arranged at a location that corresponds to the channel region of the first active layer and source and drain electrodes to electrically connect each of the source region and the drain region to an external element.

A portion of the first active layer that corresponds to the metal member may be one of the at least one undoped regions. A portion of the first active layer that corresponds to the gate electrode may be one of the at least one undoped regions. Each of the source and drain electrodes may contact a corresponding one of the exposed portions of the metal member, and wherein each of the source and drain electrodes may fill and cover a corresponding one of the contact holes. The metal member may include one of molybdenum (Mo), titanium (Ti) and a Mo—Ti alloy. The metal member may include a same material as the source and drain electrodes. The active layer may include polysilicon. The gate electrode may include a first gate electrode including a transparent conductive material and a second gate electrode arranged on the first gate electrode. The array substrate may also include a capacitor that includes a second active layer arranged in a same layer level as the first active layer, a first electrode arranged on the second active layer and arranged in a same layer level as the metal member and a second electrode arranged to face the first electrode, the second electrode including a same material as the first gate electrode. The first electrode may include a same material as the metal member. The array substrate may also include a pixel electrode that includes a same material as the first gate electrode, the pixel electrode may be arranged in a same layer level as the first gate electrode. The source and drain electrodes may include first source and drain electrodes that include a transparent conductive material and second source and drain electrodes that are arranged on the first source and drain electrodes. The array substrate may also include a pixel electrode that includes a same material as the first source and drain electrodes.

According to yet another aspect of the present invention, there is provided a method of manufacturing a thin film transistor (TFT) that includes forming a semiconductor layer and a metal layer on a substrate, forming an active layer that includes a source region, a drain region, and a channel region, and a metal member corresponding to a portion of each of the source region and the drain region by patterning the semiconductor layer and the metal layer, forming an insulating layer covering the active layer and the metal member, forming a gate electrode on the insulating layer to correspond to the channel region, doping a portion of the active layer that does not correspond to the metal member through the insulating layer and forming a pair of contact holes in the insulating layer, wherein a portion of the metal member is exposed by each of the contact holes. The forming of the active layer and the metal member may include simultaneously forming the active layer and the metal member by using a half-tone mask. The method may further include forming source and drain electrodes to fill and cover the contact holes and to contact the metal member.

According to still yet another aspect of the present invention, there is provided a method of manufacturing an array substrate for a display apparatus, the method including forming a semiconductor layer and a metal layer on a substrate, forming a thin film transistor (TFT) active layer, a capacitor active layer, a metal member and a first electrode by patterning the semiconductor layer and the metal layer, the metal member corresponding to a portion of each of source and drain regions of the TFT active layer, the first electrode being arranged on the capacitor active layer, forming an insulating layer to cover the TFT active layer, the metal member, the capacitor active layer, and the first electrode, forming a gate electrode and a second electrode on the insulating layer, the gate electrode corresponding to a channel region of the TFT active layer, the second electrode corresponding to the first electrode of the capacitor, doping a portion of the TFT active layer through the insulating layer and forming a pair of contact holes in the insulating layer, wherein portions of the metal member are exposed by the contact holes.

The patterning of the semiconductor layer and the metal layer may include simultaneously forming the TFT active layer, the capacitor active layer, the metal member and the first electrode by using a half-tone mask. The method may also include forming a source and a drain electrode to cover and fill respective ones of the pair of contact holes, each of the source and drain electrodes may contact the metal member. The method may also include forming a pixel electrode, the forming of the gate electrode, the second electrode and the pixel electrode may include forming simultaneously a first gate electrode, the pixel electrode and the second electrode on the insulating layer, each of the first gate electrode, the pixel electrode and the second electrode are comprised of a same transparent conductive material and forming a second gate electrode on the first gate electrode. The method may also include forming a pixel electrode, the forming of the pixel electrode, the source electrode and the drain electrode may include forming simultaneously the pixel electrode and first source and drain electrodes comprised of a same transparent conductive material, wherein the first source and drain electrodes cover respective ones of the contact holes and contact the metal member and forming second source and drain electrodes on the first source and drain electrodes.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Reference will now be made in detail to embodiments, examples of which are illustrated in the accompanying drawings. Also, while describing the embodiments, detailed descriptions about related well-known functions or configurations are omitted as they may diminish the clarity of the points of the embodiments of the present invention.

In the drawings, the thicknesses of layers and regions are exaggerated for clarity. It will also be understood that when a layer is referred to as being "on" another layer or substrate, it can be directly on the other layer or substrate, or intervening layers may also be present.

Turning now to FIGS. 1A to 1G, FIGS. 1A through 1G are cross-sectional views illustrating a method of manufacturing a thin film transistor (TFT) according to an embodiment of the present invention.

Figure 1A:
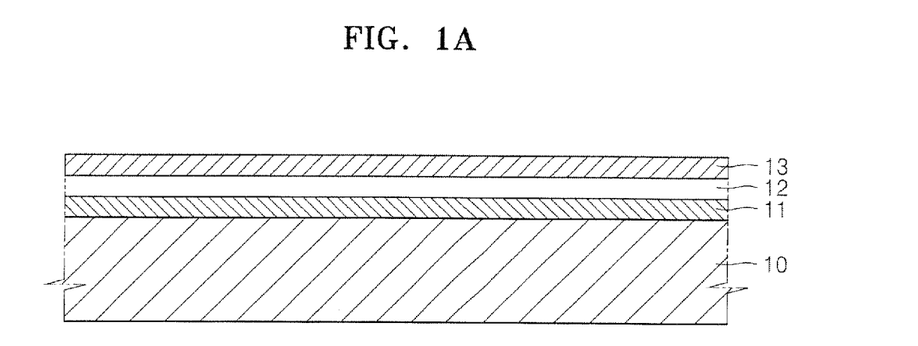
FIGS. 1A through 1G are cross-sectional views illustrating a method of manufacturing a thin film transistor (TFT) according to an embodiment of the present invention.

Referring to FIG. 1A, a buffer layer 11, a semiconductor layer 12, and a metal layer 13 are sequentially formed in the stated order on a substrate 10. The substrate 10 may be a transparent substrate, and may be made out of glass that contains $SiO_2$ as a main component, or transparent plastic.

In order to make the substrate 10 smooth and to prevent the penetration of impurities, the buffer layer 11, including $SiO_2$ and/or $SiN_x$, is formed on the substrate 10. Alternatively, the semiconductor layer 12 may be formed directly on the substrate 10 by omitting the buffer layer 11 when a buffer layer is not necessary.

The semiconductor layer 12 may be crystallized polysilicon formed by depositing amorphous silicon and then crystallizing the amorphous silicon into polysilicon. The amorphous silicon may be crystallized by using various techniques, such as a rapid thermal annealing (RTA) technique, a solid phase crystallization (SPC) technique, an excimer laser annealing (ELA) technique, a sequential lateral solidification (SLS) technique, or a Joule-heating induced crystallization (JIC) technique. In the JIC technique, Joule heat generated from a metal layer 13 may be used.

The buffer layer 11 and the semiconductor layer 12 may be formed by various deposition techniques, such as a plasma enhanced chemical vapor deposition (PECVD) technique, an atmospheric pressure chemical vapor deposition (APCVD) technique, or a low-pressure chemical vapor deposition (LPCVD).

The metal layer 13 is formed on the semiconductor layer 12. The metal layer 13 may be made out of molybdenum (Mo), titanium (Ti), or a Mo—Ti alloy. In addition, the metal layer 13 may be made out of the same material as source/drain electrode that is to be formed in a subsequent operation.

Figure 1B:
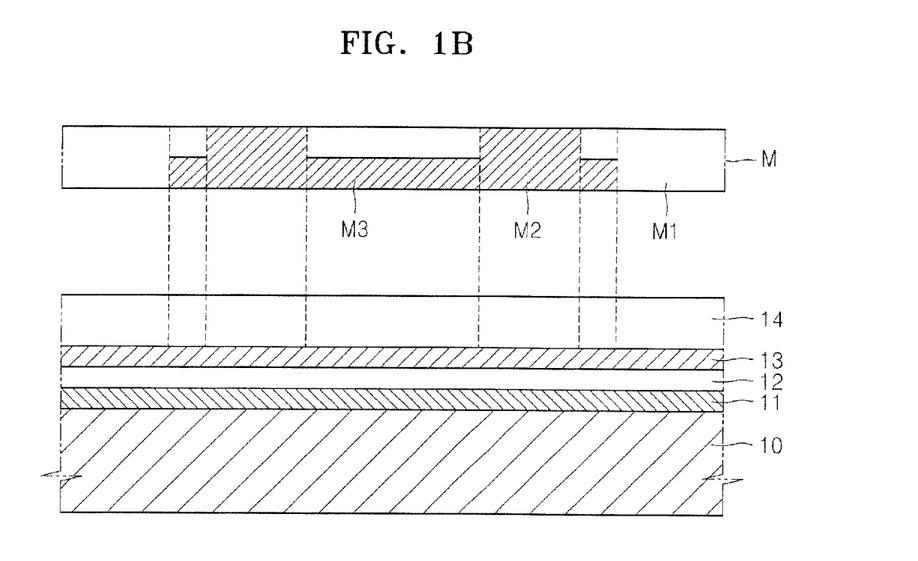

Referring now to FIG. 1B, a photoresist layer 14 is coated on an entire surface of the substrate 10 on which the buffer layer 11, the semiconductor layer 12, and the metal layer 13 are stacked. A mask M for patterning is positioned over the substrate 10, and then light with a predetermined wavelength band is irradiated onto the photoresist layer 14 to perform exposure of the photoresist layer 14. The mask M may be a half-tone mask (hereinafter, referred to as the 'half-tone mask M') that includes a semi-transmissive portion M3, a light-transmissive portion M1 and a light-blocking portion M2. The semi-transmissive portion M3 of the half-tone mask M is located to correspond to a channel region of the semiconductor layer 12 of a TFT as well as outer edges of source and drain regions.

According to the present embodiment, a positive-photoresist (PR) for removing a portion that is exposed to light is used. However, it will be understood by one of ordinary skill in the art that a negative-PR may instead be used.

Figure 1C:
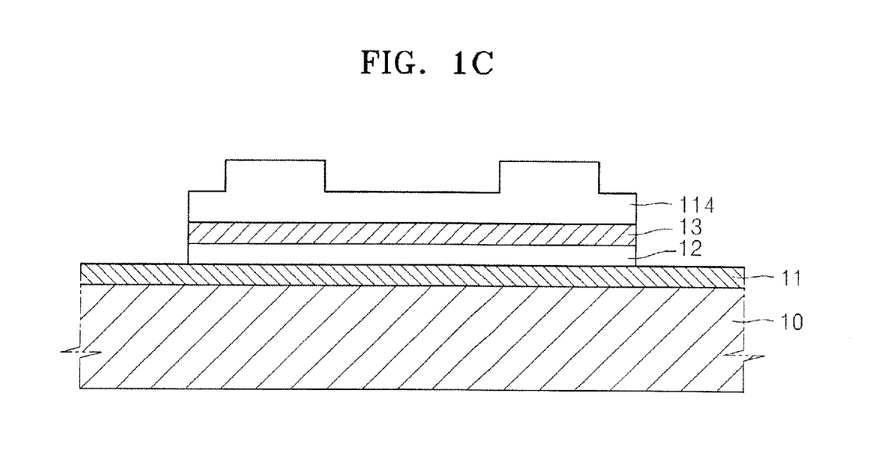

Referring now to FIG. 1C, the semiconductor layer 12 and the metal layer 13 are etched by using the photoresist layer 14 as an etch mask.

After the photosensitized portion of the photoresist layer 14 of FIG. 1B is removed, portions of the photoresist layer 14 that corresponds to the light-transmissive portion M1 of the half-tone mask M are removed by developing, and portions of the photoresist layer 14 that correspond to the light-blocking portion M2 and the semi-transmissive portion M3, respectively, remain to form a photoresist pattern 114. In this case, the thickness of the portion of photoresist pattern 114 that corresponds to the semi-transmissive portion M3 may be smaller than the thickness of the portion of the photoresist pattern 114 that corresponds to the light-blocking portion M2. The ratio of thicknesses of photoresist layer 114 of portions that correspond to semi-transmissive portion M3 to the portion that corresponds to light-blocking portion M2 may be controlled according to a thickness or a composition ratio of a material used in the semi-transmissive portion M3 of mask M.

The photoresist pattern 114 is used as a mask, and the semiconductor layer 12 and the metal layer 13 that are formed on the substrate 10 undergo a first etch by an etching apparatus. In this case, a wet etching technique or a dry etching technique may be used. When the dry etching technique is used, a plasma etching technique, a reactive ion etching (RIE) technique, a reactive sputter etching technique, a reactive ion beam milling technique, or the like may be used. When the wet etching technique is used, the semiconductor layer 12 and the metal layer 13 may be etched by an etchant capable of simultaneously etching the semiconductor layer 12 and the metal layer 13, or alternatively may be respectively etched by different etchants. The semiconductor layer 12 and the metal layer 13 are etched to produce predetermined patterns so that the sizes of the patterns are determined according to the size of the TFT, and the semiconductor layer 12 and the metal layer 13 are formed to have coincident patterns having the same size. A structure below the photoresist pattern 114, that is, the semiconductor layer 12 and the metal layer 13, will be formed into an active layer 112 and a metal member (or wire) 113 of the TFT.

Figure 1D:
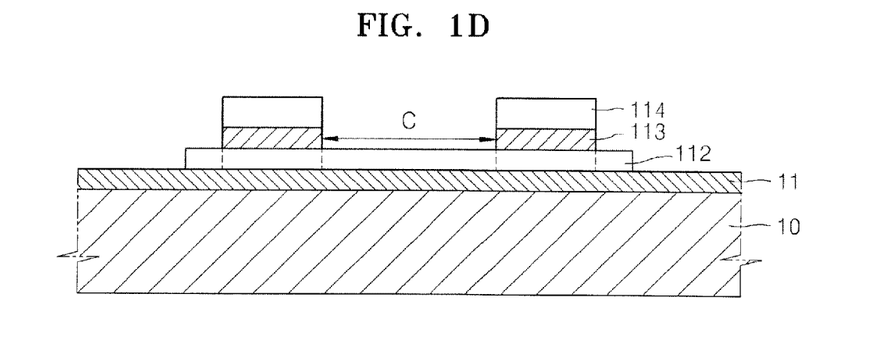

Referring now to FIG. 1D, the photoresist layer 114 and the metal layer 13 undergo a second etch using the photoresist layer 114 as an etch mask. Therefore, in the second etch, portions of photoresist layer 114 and portions of the metal layer 13 that correspond to half-tone portions M3 of mask M are etched so that the active layer 112 including a channel region C may be formed with metal wire 113 being arranged at locations that correspond to a source region S and a drain region D of the active layer 112. The length of the channel region C may be determined according to the size and use of the TFT. Furthermore, because the thicknesses of the photoresist pattern 114 of FIG. 1C after the first etch varies between areas corresponding to M2 and M3 of mask M of FIG. 1B, a photoresist pattern 114 remains at areas corresponding to M2 of mask M after the second etch as illustrated in FIG. 1D.

According to the present embodiment, the metal wire 113 is formed so that an edge of the metal wire 113 may be spaced apart from an edge of the active layer 112 by a predetermined distance. Alternatively, the metal wire 113 may be formed so that the edge of the metal wire 113 may be flush with an edge of the active layer 112.

Figure 1E:
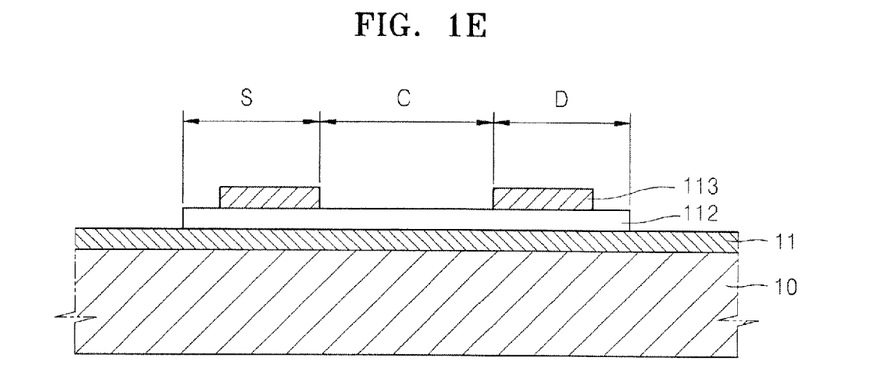

Referring now to FIG. 1E, portions of the photoresist pattern 114 that remain on the metal wire 113 are removed. The active layer 112 includes the source region S, the drain region D, and the channel region C. The locations of the source region S and the drain region D may be reversed.

The metal wire 113 functions as an etch stop in a subsequent step and prevents the active layer 112 from being damaged due to over-etching that may occur in a subsequent operation of forming contact holes in an insulating layer in which source and drain electrodes are to be formed. In addition, the metal wire 113 functions as an ohmic contact layer to reduce contact resistance between the active layer and each of the source and drain electrodes.

Figure 1F:
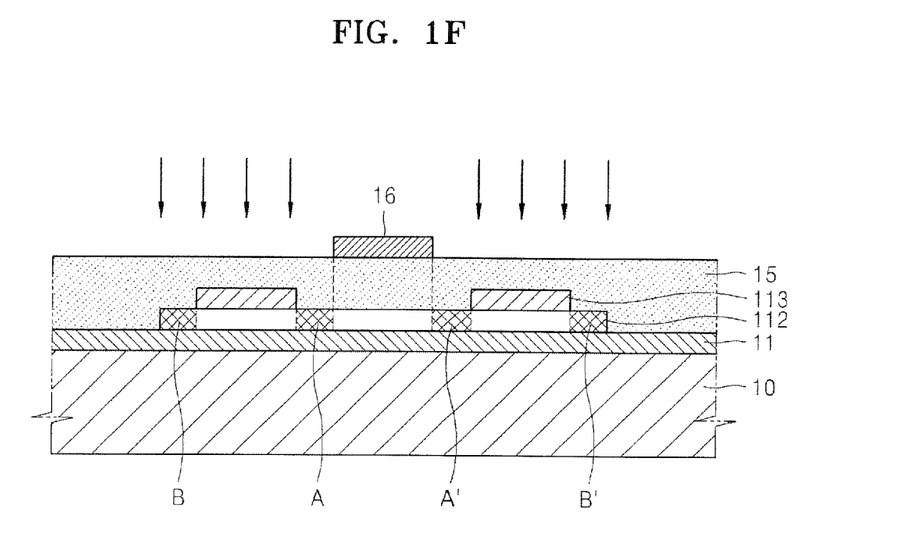

Referring now to FIG. 1F, a first insulating layer 15 is stacked on an entire surface of the substrate 10 on which the active layer 112 and the metal wire 113 are formed. The first insulating layer 15 may be formed by depositing an inorganic material, such as $SiO_x$ or $SiN_x$, by using a PECVD technique, an APCVD technique, a LPCVD technique, or an ERC technique. The first insulating layer 15 may include a single layer or a plurality of layers, and may function as a gate insulating layer.

A gate electrode 16 is formed on the first insulating layer 15 to correspond to the channel region C of the active layer 112. The gate electrode 16 may be made out of at least one material selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The gate electrode 16 is then used as a self-aligned ion implantation mask, and the active layer 112 is doped with ion impurities by using a technique, such as an ion injection technique, in order to form an ohmic region for the source and drain electrodes in the active layer 112. The ion impurities may be Group III or V elements.

As a result of doping, portions of the active layer 112 which do not correspond to the gate electrode 16 and/or the metal wire 113, are doped with the ion impurities. That is, a boundary region A between the channel region C and the source region S of the active layer 112, a boundary region A' between the channel region C and the drain region D, an outer region B of the source region S, and an outer region B' of the drain region D are doped with the ion impurities. Thus, an ohmic region formed in the active layer 112 includes a doped polysilicon thin film and a non-doped polysilicon thin film. In one variation, the outer region B of the source region S, and the outer region B' of the drain region D may instead remain undoped with the ion impurities. In another variation, the thickness of the metal wire 113 may be made thin enough to allow doping impurities to pass, portions of the source region S and the drain region D that are formed below the metal wire 113 may also be doped.

A doping range of the boundary region A between the channel region C and the source region S, and a doping range of the boundary region A' between the channel region C and the drain region D may be determined according to the length of a channel region C.

Alternatively, between forming of the first insulating layer 15 and forming of the gate electrode 16, a preliminary doping operation may be performed using dopants of an opposite polarity so that the channel region C may be doped.

Figure 1G:
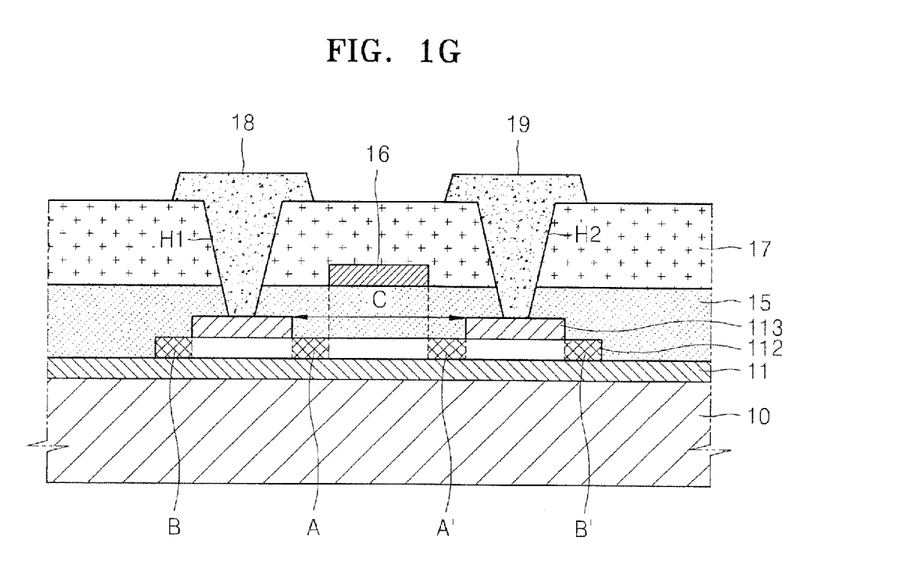

Referring now to FIG. 1G, a second insulating layer 17 is formed on an entire surface of the substrate 10 on which the gate electrode 16 is formed, contact holes are formed through both the second insulating layer 17 and the first insulating layer 15, and then a source electrode 18 and a drain electrode 19 are formed. The second insulating layer 17 is formed to be substantially thicker than the first insulating layer 15 so that there is ample insulation between the gate electrode 16 and each of the source and drain electrodes.

The second insulating layer 17 may be made out of at least one organic insulating material selected from the group consisting of polyimide, a polyamide, an acryl resin, benzocyclobutene, and a phenol resin by using a spin coating technique. The second insulating layer 17 may be made out of the same inorganic insulating material as the first insulating layer 15 as well as an organic insulating material, or alternatively may be formed by alternately forming an organic insluting material and an inorganic insulating material.

Then, contact holes H1 and H2 are formed in the first insulating layer 15 and in the second insulating layer 17. Upon formation of contact holes H1 and H2, a portion of the metal wire 113 is exposed by using the metal wire 113 as an etch stop. Thus, the metal wire 113 is surrounded by the first insulating layer 15, and portions of the metal wire 113 are exposed through the contact holes H1 and H2.

The source electrode 18 and the drain electrode 19 that respectively correspond to the source region S and the drain region D of the active layer 112 cover the second insulating layer 17 while filling the contact holes H1 and H2. The source electrode 18 and the drain electrode 19 may be made out of the same material as the gate electrode 16, that is, at least one material selected from the group consisting of Al, Pt, Pd, Ag, Mg, Au, Ni, Nd, Ir, Cr, Li, Ca, Mo, Ti, W, and Cu, but are not limited thereto. Thus, the source electrode 18 and the drain electrode 19 may instead be made out of other various conductive materials. The source electrode 18 and the drain electrode 19 partially contact the metal wire 113 formed on the active layer 112, and electrically connect the source and drain regions of active layer 112 to an external device. In addition, one of the source electrode 18 and the drain electrode 19 may be electrically connected to a pixel electrode (not shown) of a display apparatus.

Turning now to FIGS. 2A through 2G, FIGS. 2A through 2G are cross-sectional views of a method of manufacturing a substrate of a display apparatus including a TFT and a capacitor, according to an embodiment of the present invention.

Figure 2A:
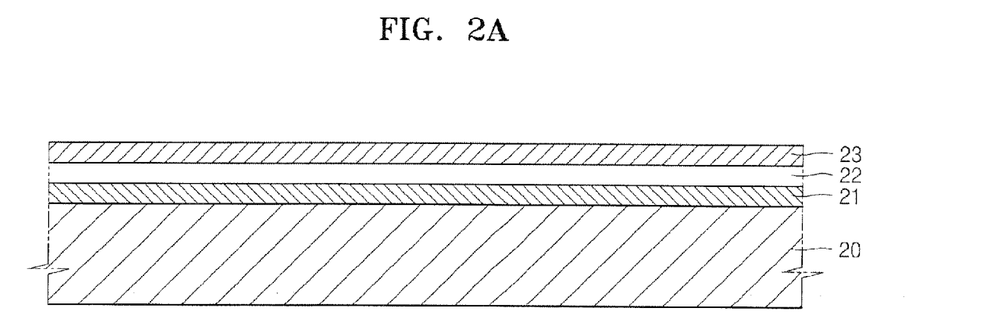
FIGS. 2A through 2G are cross-sectional views illustrating a method of manufacturing a substrate of a display apparatus including a TFT and a capacitor according to an embodiment of the present invention.

Referring now to FIG. 2A, a buffer layer 21, a semiconductor layer 22, and a metal layer 23 may be sequentially formed in the stated order on a substrate 20. The substrate 20 may be a transparent substrate, and may be made out of glass that contains $SiO_2$ as a main component, or transparent plastic. In order to make the substrate 20 smooth and to prevent the penetration of impurities, the buffer layer 21, including $SiO_2$ and/or $SiN_x$, is formed on the substrate 20. Alternatively, the semiconductor layer 22 may be formed directly on the substrate 20 by omitting the buffer layer 21 when it is deemed that the buffer layer 21 is not necessary.

The semiconductor layer 22 is formed by depositing amorphous silicon and then crystallizing the amorphous silicon into polysilicon. Amorphous silicon may be crystallized by using various techniques, such as a RTA technique, a SPC technique, an ELA technique, a SLS technique, or a JIC technique. In the JIC technique, Joule heat generated from a metal layer 23 may be used to crystalize semiconductor layer 22. The buffer layer 21 and the semiconductor layer 22 may be formed by various deposition techniques, such as a PECVD technique, an APCVD technique, or a LPCVD technique. The metal layer 23 may be made out of Mo, Ti, or a Mo—Ti alloy. In addition, the metal layer 23 may be made out of the same material as source/drain electrodes that are formed in a subsequent operation.

Figure 2B:
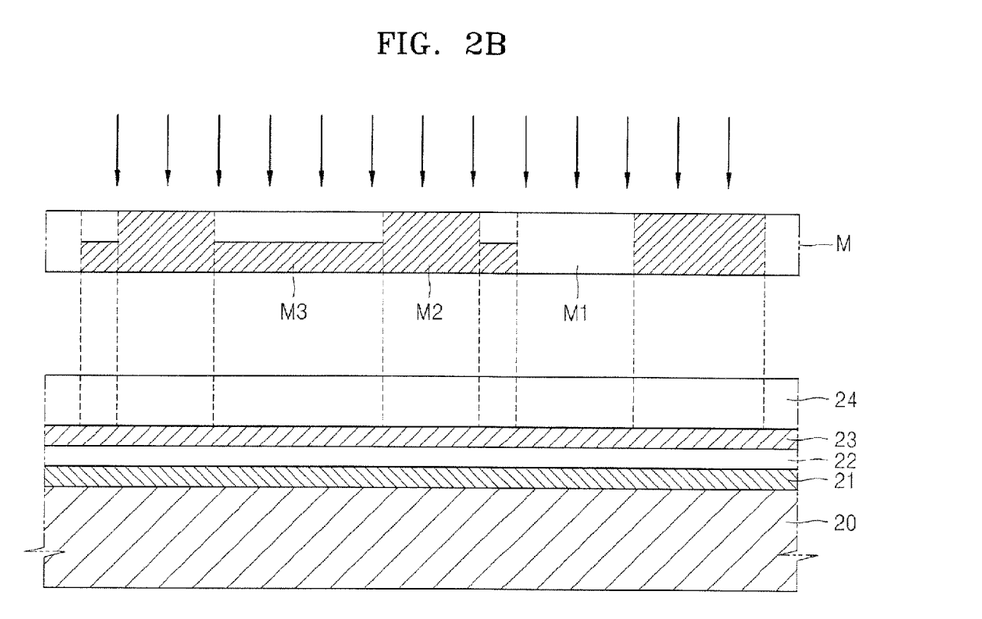

Referring now to FIG. 2B, a photoresist layer 24 is coated on an entire surface of the substrate 20 on which the buffer layer 21, the semiconductor layer 22, and the metal layer 23 are stacked. A mask M for patterning is positioned on the substrate 20, and then light with a predetermined wavelength band is irradiated onto the photoresist layer 24 to perform exposure on the photoresist layer 24. The mask M may be a half-tone mask (hereinafter, referred to as the 'half-tone mask M') that includes a semi-transmissive portion M3 as well as a light-transmissive portion M1 and a light-blocking portion M2. The semi-transmissive portion M3 of the half-tone mask M is located to correspond to a channel region of the semiconductor layer 22 of the TFT and an edge of source and drain regions of the TFT.

Figure 2C:
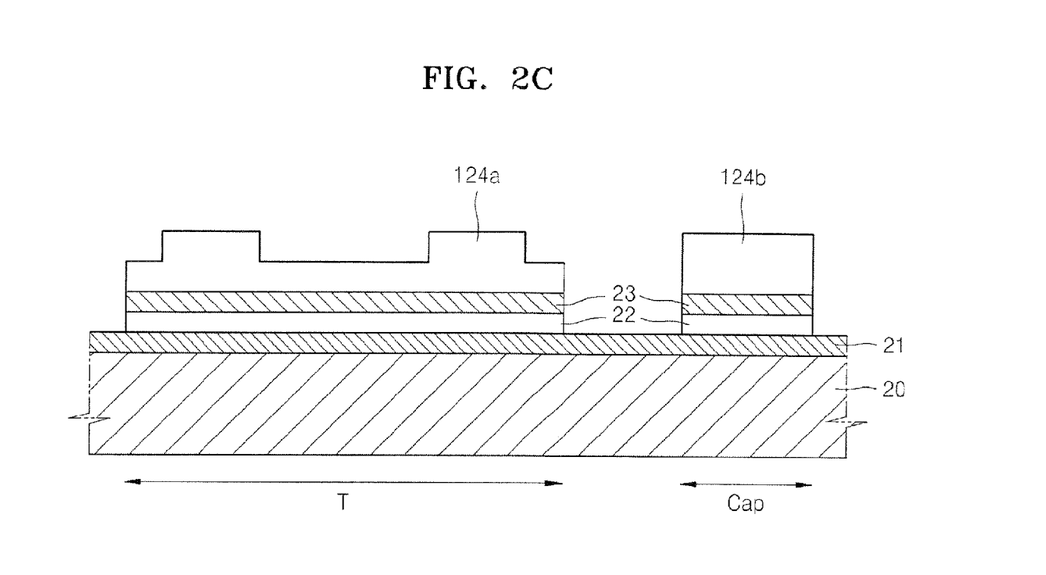

Referring now to FIG. 2C, the semiconductor layer 22 and the metal layer 23 are etched by using the photoresist layer 24 as an etch mask. After the photosensitized portion of the photoresist layer 24 of FIG. 2B is removed by developing a portion of the photoresist layer 24, a photoresist pattern 124a of a TFT region 'T' and a photoresist pattern 124b of a capacitor region 'Cap' remains. In this case, a portion of the photoresist layer 24 that corresponds to the light-transmissive portion M1 of the half-tone mask M is removed, and portions of the photoresist layer 24 that respectively correspond to the light-blocking portion M2 and the semi-transmissive portion M3 remain.

The photoresist patterns 124a and 124b are used as an etch mask, and the semiconductor layer 22 and the metal layer 23 that are formed on the substrate 20 undergo a first etch by an etching apparatus. In this case, a wet etching technique or a dry etching technique may be used. The semiconductor layer 22 and the metal layer 23 may be simultaneously etched, or alternatively, the semiconductor layer 22 and the metal layer 23 may be sequentially etched.

The semiconductor layer 22 and the metal layer 23 are etched to produce predetermined patterns so that the sizes of the patterns are determined according to the size of the TFT in the TFT region 'T', and are etched to produce predetermined patterns so that the sizes of the patterns are determined according to the size of the capacitor in the capacitor region 'Cap'. After the first etch and in the TFT region 'T' and in the capacitor region 'Cap', the semiconductor layer 22 and the metal layer 23 are formed in patterns having the same size.

A structure below the photoresist patterns 124a and 124b, that is, the semiconductor layer 22 and the metal layer 23, will be formed as a first active layer 122a and a metal wire 123a of the TFT, and a second active layer 122b and a first capacitor electrode 123b of the capacitor.

Figure 2D:
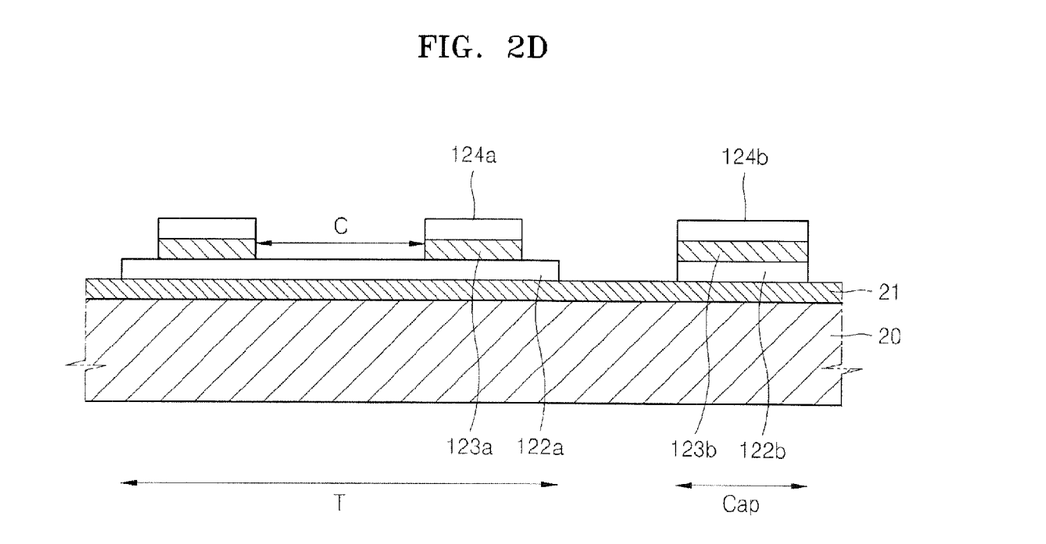

Referring now to FIG. 2D, the semiconductor layer 22 and the metal layer 23 undergo a second etch by using the photoresist patterns 124a and 124b as an etch mask. When the semiconductor layer 22 and the metal layer 23 are etched a second time, only TFT region T is etched as the second active layer 122b and the first capacitor electrode 123b of the capacitor region 'Cap' are not additionally patterned. A portion of the metal layer 23 formed below the photoresist pattern 124a is etched in the second etch so that the first active layer 122a including the channel region C may be formed and so that the metal wire 123a may also be formed to correspond to the source region S and the drain region D of the first active layer 122a.

The metal wire 123a is formed so that an edge of the metal wire 123a may be spaced apart from an edge of the first active layer 122a by a predetermined distance that corresponds to outer regions B and B'. Alternatively, the metal wire 123a may instead be formed so that the edge of the metal wire 123a may be flush with the edge of the first active layer 122a.

Figure 2E:
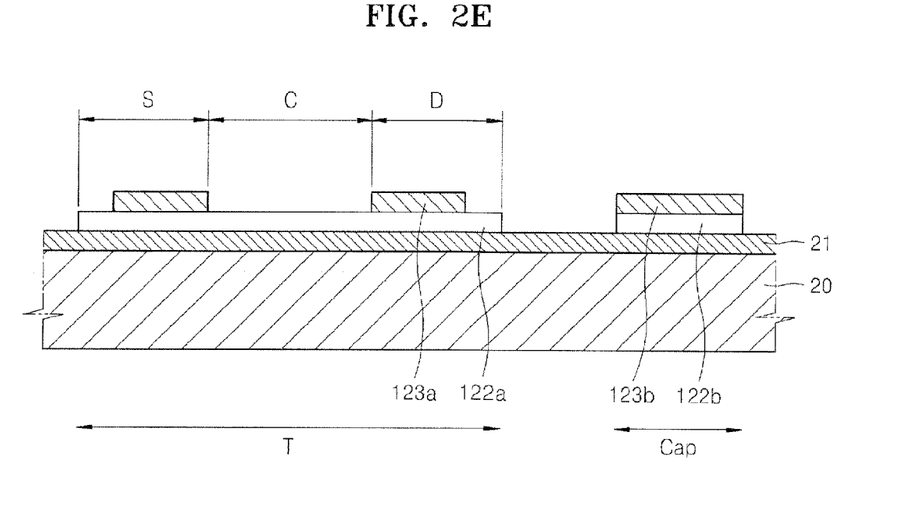

Referring now to FIG. 2E, portions of the photoresist patterns 124a and 124b that remain on the metal wire 123a of the TFT region 'T' and the first capacitor electrode 123b of the capacitor region 'Cap' are removed after the second etch. The first active layer 122a includes the source region S, the drain region D, and the channel region C. The locations of the source region S and the drain region D may be reversed.

The metal wire 123a functions as an etch stop and prevents the first active layer 122a from being damaged due to over-etching that may occur in a subsequent operation of forming contact holes in an insulating layer to allow for the formation of source and drain electrodes. In addition, the metal wire 123a functions as an ohmic contact layer.

Figure 2F:
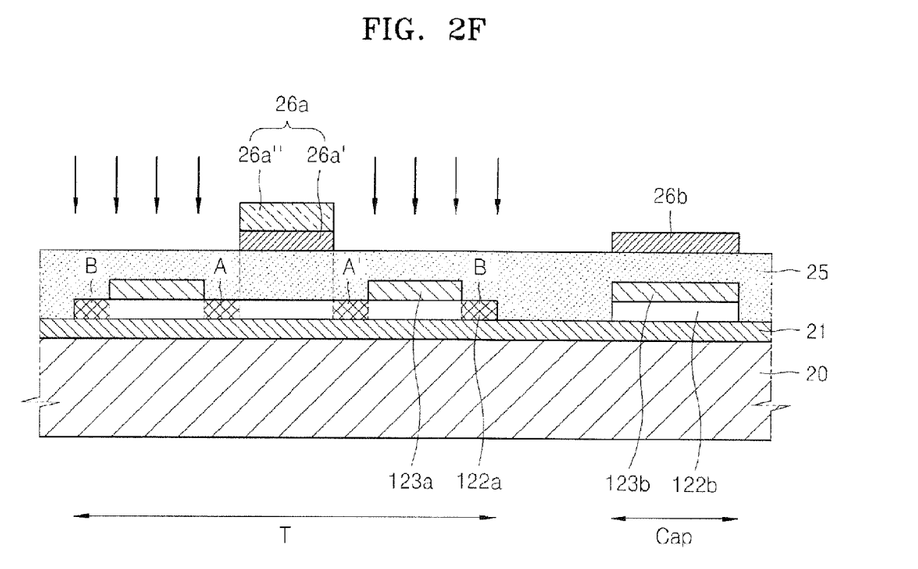

Referring now to FIG. 2F, a first insulating layer 25 is formed on an entire surface of the substrate 20 on which the first active layer 122a and the metal wire 123a of the TFT region 'T' and the second active layer 122b and the first capacitor electrode 123b of the capacitor region 'Cap' are formed. The first insulating layer 25 may be formed by depositing an inorganic material, such as $SiO_x$ or $SiN_x$, by using a PECVD technique, an APCVD technique, a LPCVD technique, or an ERC technique. The first insulating layer 25 may include a single layer or a plurality of layers. In addition, the first insulating layer 25 may serve as a gate insulating layer of the TFT while serving as a dielectric layer of the capacitor.

A gate electrode 26a of the TFT region 'T' and a second capacitor electrode 26b of the capacitor region 'Cap' are formed on the first insulating layer 25. A first gate electrode 26a' corresponding to the channel region C of the first active layer 122a, and the second capacitor electrode 26b corresponding to the second active layer 122b are formed on the first insulating layer 25. The first gate electrode 26a' and the second capacitor electrode 26b may be simultaneously produced, may be made out of the same material, may have the same thickness, and may be made out of at least one transparent material selected from the group consisting of ITO, IZO, ZnO, or $In_2O_3$.

Then, a second gate electrode 26a" is formed on the first gate electrode 26a' to form the gate electrode 26a that includes the combination of the first gate electrode 26a' and the second gate electrode 26a". The second gate electrode 26a" may be made out of at least one material selected from the group consisting of Al, Pt, Pd, Ag, Mg, Au, Ni, Nd, Ir, Cr, Li, Ca, Mo, Ti, W, and Cu.

The gate electrode 26a and the second capacitor electrode 26b may be formed by sequentially stacking a conductive layer for forming the first gate electrode 26a' and the second capacitor electrode 26b, and a conductive layer for forming the second gate electrode 26a" in the stated order, and then removing a portion of the conductive layer formed on the second capacitor electrode 26b.

Upon completion of the formation of the gate electrode 26a, the gate electrode 26a is used as a self-aligned ion implantation mask, and the first active layer 122a of the TFT region 'T' is doped with ion impurities by using a technique, such as an ion injection technique, in order to form an ohmic region for the source and drain regions. The ion impurities may be Group III or V elements. As a result of doping, portions in the TFT region 'T' that do not correspond to the gate electrode 26a and/or the metal wire 123a, that is B, B', A and A', are doped with the ion impurities. In other words, the boundary region A between the channel region C and the source region S of the first active layer 122a, the boundary region A' between the channel region C and the drain region D, the outer region B of the source region S, and the outer region B' of the drain region D are doped with the ion impurities. Thus, an ohmic region formed in the first active layer 122a includes a doped polysilicon thin film portions and a non-doped polysilicon thin film portions. In a variation to the above, the outer region B of the source region S and the outer region B' of the drain region D may remain undoped with the ion impurities. A doping range of the boundary region A between the channel region C and the source region S, and a doping range of the boundary region A' between the channel region C and the drain region D may be determined according to the length of a channel region C.

In another variation, if the thickness of the metal wire 123a is thin enough to allow impurities to pass, all portion in the first active layer 122a of the TFT region 'T' that does not correspond to the gate electrode 26a, along with the second active layer 122b of the capacitor region 'Cap', may be simultaneously doped with the doping impurities. Alternatively, the second active layer 122b of the capacitor region 'Cap' and the first active layer 122a of the TFT region 'T' may be doped at different times rather than being simultaneously doped, may be doped with different dopants, and the concentrations of the dopants may be adjusted to be different from each other. In yet another variation, if the metal wires 123a are thin enough to allow ion impurities to pass, a portion of the first active layer 122a that corresponds to the metal wire 123a may be doped with the doping impurities while the second active layer 122b of the capacitor region 'Cap' may not be doped with the doping impurities. In each of these variations, it is to be further appreciated that the channel region C may be lightly doped with impurities having a different polarity than that of the other doped regions, this doping of the channel region C taking place after the forming of the first insulating layer 25 and before the forming of the gate electrode 26a.

Figure 2G:
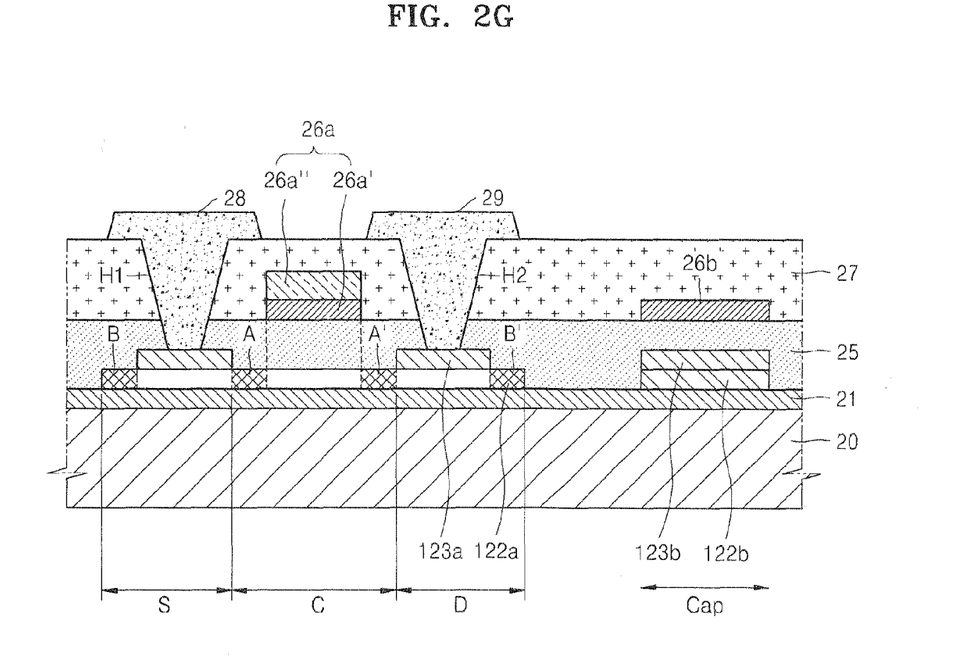

Referring now to FIG. 2G, a second insulating layer 27 is formed on an entire surface of the substrate 20 on which the gate electrode 26a, the second capacitor electrode 26b and the first insulating layer 25 are formed, contact holes H1 and H2 are then formed in both the first and second insulating layers 25 and 27, and then a source electrode 28 and a drain electrode 29 are formed. The second insulating layer 27 may be made out of the same inorganic insulating material as the first insulating layer 25 as well as an organic insulating material, or alternatively may be formed by alternately forming an organic insulating material and an inorganic insulating material. The second insulating layer 27 may be made out of at least one organic insulating material selected from the group consisting of polyimide, a polyamide, an acryl resin, benzocyclobutene, and a phenol resin by using a spin coating technique.

The second insulating layer 27 is formed to have a sufficient thickness. Specifically, the second insulating layer 27 is formed to have a greater thickness than that of the first insulating layer 25, and functions as an interlayer insulating layer between the gate electrode 26a and the source/drain electrodes 28 and 29 of the TFT.

After formation of the second insulating layer 27, contact holes H1 and H2 are formed in the first insulating layer 25 and in the second insulating layer 27. Upon formation of contact holes H1 and H2, portions of the metal wire 123a are exposed as the metal wire 123a is used as an etch stop. Upon formation of contact holes H1 and H2, the exposed portions of the metal wire 123a are surrounded by the first insulating layer 25.

The source electrode 28 and the drain electrode 29 that respectively correspond to the source region S and the drain region D of the first active layer 122a cover the second insulating layer 27 while filling the contact holes H1 and H2. The source electrode 28 and the drain electrode 29 may be made out of the same material as the second gate electrode 26a", that is, at least one material selected from the group consisting of Al, Pt, Pd, Ag, Mg, Au, Ni, Nd, Ir, Cr, Li, Ca, Mo, Ti, W, and Cu, but are not limited thereto. Thus, the source electrode 28 and the drain electrode 29 may instead be made out of other various conductive materials. One of the source electrode 28 and the drain electrode 29 may be electrically connected to a pixel electrode (not shown) of a display apparatus.

Figure 3:
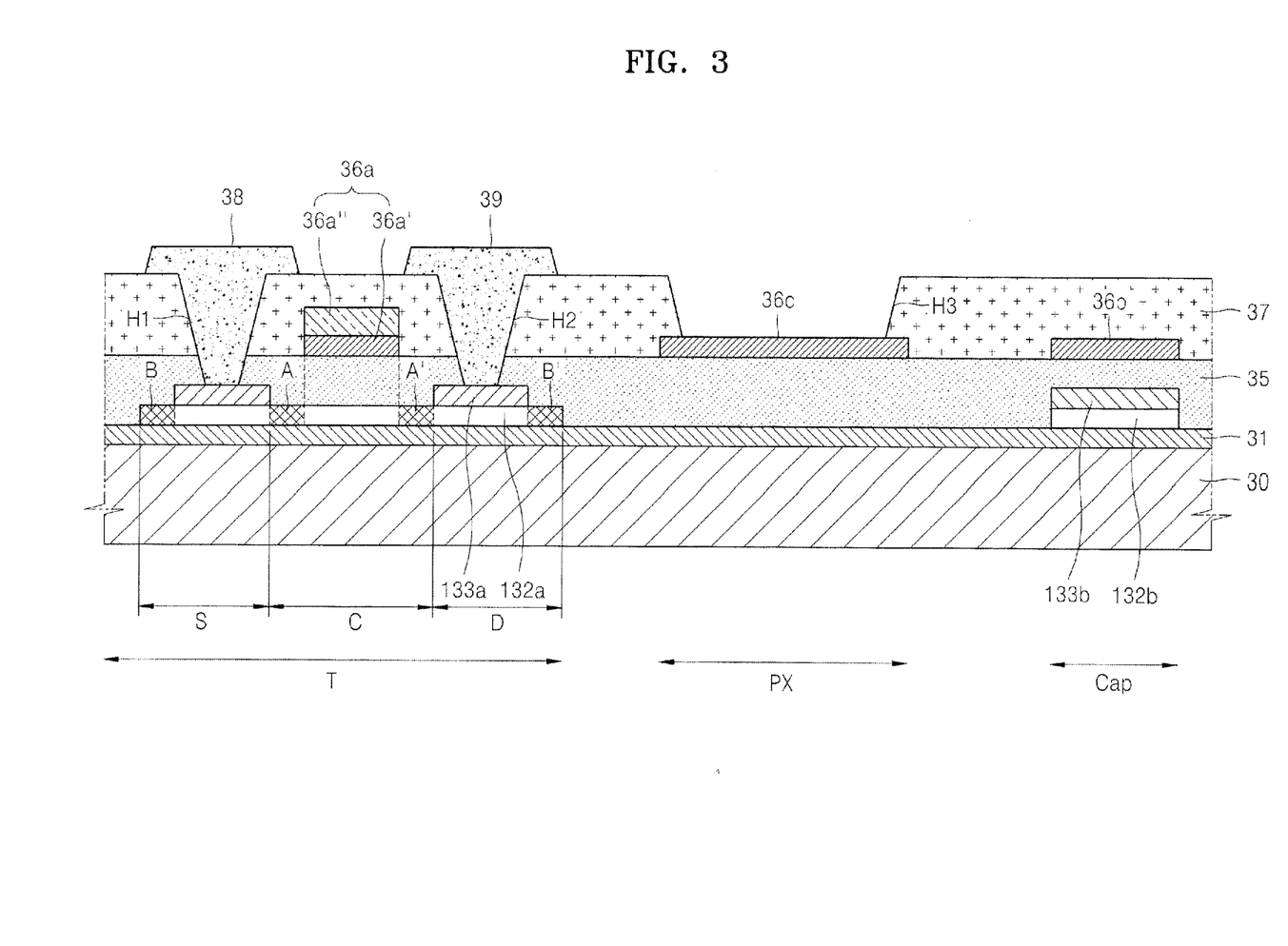
FIG. 3 is a cross-sectional view of a display apparatus including a TFT and a capacitor according to an embodiment of the present invention.

Turning now to FIG. 3, FIG. 3 is a cross-sectional view of a display apparatus including a TFT and a capacitor, according to an embodiment of the present invention. Unlike the display structure of FIG. 2G, the display apparatus of FIG. 3 further includes a pixel electrode 36c in pixel region PX to energize a light-emitting device. Referring now to FIG. 3, the display apparatus includes the TFT, a light-emitting device, and the capacitor that are formed in the TFT region 'T', a pixel region PX, and the capacitor region 'Cap', respectively. The TFT and the capacitor are manufactured by using the same method as the methods of manufacturing the TFT and the capacitor of FIGS. 1A through 2G, and thus their detailed descriptions will be omitted.

In order to make a substrate 30 smooth and to prevent the penetration of impurities, a buffer layer 31, including $SiO_2$ and/or $SiN_x$, is formed on the substrate 30. The buffer layer 31 may be omitted if it is deemed unnecessary.

The TFT includes a first active layer 132a, a gate electrode 36a, and source and drain electrodes 38 and 39. The first active layer 132a may be made out of polysilicon, and may be formed by depositing amorphous silicon and then crystallizing the amorphous silicon into polysilicon by using a laser beam or Joule heating.

A metal wire 133a is formed on the first active layer 132a to correspond to each of the source region S and the drain region D. The metal wire 133a may be made out of Mo, Ti, or a Mo—Ti alloy. The metal wire 133a serves as an etch stop by preventing the first active layer 132a from being damaged due to over-etching that may occur in a subsequent operation of forming contact holes H1 and H2 in an insulating layer 35 while serving as an ohmic contact layer.

By performing a first and second etch on the stack layer of polysilicon and a metal layer by using a photoresist layer patterned by a half-tone mask, the first active layer 132a including the channel region C, is formed while simultaneously forming the metal wire 133a that corresponds to each of the source region S and the drain region D. An edge of the metal wire 133a may be spaced-apart from an edge of the first active layer 132a, or alternatively, the edge of the metal wire 133a may be flush with the edge of the first active layer 132a.

A first insulating layer 35 is interposed between the gate electrode 36a and the first active layer 132a so as to insulate the gate electrode 36a from the first active layer 132a. The gate electrode 36a includes a first gate electrode 36a' and a second gate electrode 36a". The first gate electrode 36a' is made out of a transparent conductive material. The gate electrode 36a and the metal wire 133a may be used as ion implantation masks, and portions of the first active layer 132a that do not correspond to the gate electrode 36a and the metal wire 133a are doped with ion impurities by using a technique such as an ion injection in order to form an ohmic region for use by the TFT and source and drain electrodes. The ion impurities may be Group III or V elements. The boundary region A between the channel region C and the source region S of the first active layer 132a, the boundary region A' between the channel region C and the drain region D, the outer region B of the source region S, and the outer region B' of the drain region D are doped with ion impurities. In this case, the outer region B of the source region S and the outer region B' of the drain region D may instead not be doped. If the thickness of the metal wire 133a is sufficiently thin so that doping impurities may pass through, a portion of the first active layer 132a that corresponds to the metal wire 133a may also be doped.

The source electrode 38 and the drain electrode 39 are formed by filling and covering the contact holes H1 and H2 that are formed in the first insulating layer 35 and a second insulating layer 37. Each of the source electrode 38 and the drain electrode 39 partially contacts the metal wire 133a. In addition, the source electrode 38 and the drain electrode 39 correspond to the source region S and the drain region D of the first active layer 132a, respectively. In addition, the source electrode 38 and the drain electrode 39 may be made out of the same material as the metal wire 133a.

The capacitor includes a second active layer 132b, a first capacitor electrode 133b, and a second capacitor electrode 36b. The second active layer 132b and the first active layer 132a may be formed in the same layer level at the same time and may be made out of the same material. The first insulating layer 35 is a dielectric layer that is interposed between the first capacitor electrode 133b and the second capacitor electrode 36b. The first capacitor electrode 133b and the metal wire 133a of the TFT may be made out of the same material and may be produced at the same time. In addition, the second capacitor electrode 36b and the first gate electrode 36a' of the TFT may be made out of the same material and may be produced at the same time. If the thickness of the first capacitor electrode 133b is sufficiently thin so that a dopant may pass through, the second active layer 132b along with the first active layer 132a of the TFT may be simultaneously doped with the same dopant or with different dopants. The light-emitting device includes a pixel electrode 36c made out of a transparent conductive material. The pixel electrode 36c, the first gate electrode 36a' of the TFT, and the second capacitor electrode 36b of the capacitor may be made out of the same material and may be produced at the same time. The second insulating layer 37 is formed on an entire surface of the substrate 30 to cover the pixel electrode 36c, and an opening H3 is formed in the second insulating layer 37 to expose a portion of the pixel electrode 36c.

If the display apparatus is an organic light emitting display apparatus, the light-emitting device is an organic light-emitting device (EL). Although not illustrated in FIG. 3, an organic layer including an emissive layer and a cathode may be formed on the pixel electrode 36c within the opening H3.

Figure 4:
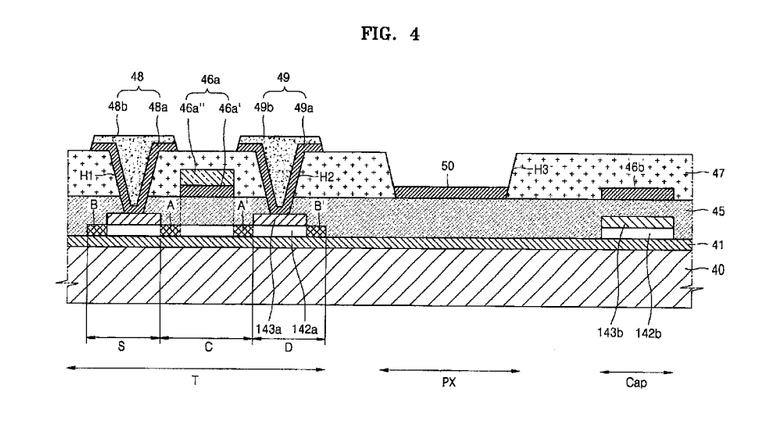
FIG. 4 is a cross-sectional view of a display apparatus including a TFT and a capacitor, according to another embodiment of the present invention.

Turning now to FIG. 4, FIG. 4 is a cross-sectional view of a display apparatus including a TFT, a capacitor and a light emitting device according to another embodiment of the present invention. Referring now to FIG. 4, the display apparatus includes the TFT, the light-emitting device, and the capacitor that are formed in the TFT region 'T', a pixel region PX, and the capacitor region 'Cap', respectively. The TFT and the capacitor are manufactured by using the same method as the methods of manufacturing the TFT and the capacitor of FIGS. 1A through 2G, and thus their detailed descriptions will be omitted.

In order to make a substrate 40 smooth and to prevent the penetration of impurities, a buffer layer 41 including $SiO_2$ and/or $SiN_x$ is formed on the substrate 40. The buffer layer 41 may be omitted if it is deemed not necessary.

The TFT includes a first active layer 142a, a gate electrode 46a, and source and drain electrodes 48 and 49. The first active layer 142a may be made out of polysilicon, and may be formed by depositing amorphous silicon and then crystallizing the amorphous silicon into polysilicon by using a laser beam or using Joule heating. A metal wire 143a is formed on the first active layer 142a to correspond to each of the source region S and the drain region D. The metal wire 143a may be made out of Mo, Ti, or a Mo—Ti alloy. The metal wire 143a later serves as an ohmic contact layer while serving as an etch stop by preventing the first active layer 142a from being damaged due to over-etching that may occur in a subsequent operation of forming contact holes H1 and H2 in insulating layers 47 and 45.

By performing first and second etch steps on a stack that includes a polysilicon layer and a metal layer by using a photoresist pattern produced by a half-tone mask, the stack of layers are patterned to produce the first active layer 142a including the channel region C simultaneously with the metal wire 143a corresponding to each of the source region S and the drain region D. An edge of the metal wire 143a may be spaced inward from an edge of the first active layer 142a. Alternatively, the edge of the metal wire 143a may instead be flush with the edge of the first active layer 142a.

A first insulating layer 45 is interposed between the gate electrode 46a and the first active layer 142a to insulate the gate electrode 46a from the first active layer 142a. The gate electrode 46a includes a first gate electrode 46a' and a second gate electrode 46a". The first gate electrode 46a' is made out of a transparent conductive material. The gate electrode 46a and the metal wire 143a are used as doping masks, and portions of the first active layer 142a that do not correspond to the gate electrode 46a and the metal wire 143a are doped with ion impurities by using a technique such as an ion injection in order to form an ohmic region for use by the TFT and source and drain electrodes. The ion impurities may be Group III or V elements.

The boundary region A between the channel region C and the source region S of the first active layer 132a, the boundary region A' between the channel region C and the drain region D, the outer region B of the source region S, and the outer region B' of the drain region D are doped with ion impurities. Alternately, the outer region B of the source region S and the outer region B' of the drain region D may not be doped. Also alternately, if the thickness of the metal wire 143a is sufficiently thin to allow doping impurities to pass through, a portion of the first active layer 142a that corresponds to the metal wire 143a may also be doped.

The source electrode 48 and the drain electrode 49 are formed by filling and covering contact holes H1 and H2 that are formed in the first insulating layer 45 and in a second insulating layer 47. The source electrode 48 and the drain electrode 49 correspond to the source region S and the drain region D of the first active layer 142a, respectively. In the embodiment of FIG. 4, the source electrode 48 includes a first source electrode 48a and a second source electrode 48b, and the drain electrode 49 includes a first drain electrode 49a and a second drain electrode 49b. The first source electrode 48a and the first drain electrode 49a may be made out of a transparent conductive material, such as ITO, IZO, ZnO, or $In_2O_3$, and may each contact a portion of the metal wire 143a.

The capacitor includes a second active layer 142b, a first capacitor electrode 143b, and a second capacitor electrode 46b. The first insulating layer 45 is a dielectric layer that is interposed between the first capacitor electrode 143b and the second capacitor electrode 46b. The first capacitor electrode 143b and the metal wire 143a of the TFT may be made out of the same material and may be produced at the same time. In addition, the second capacitor electrode 46b and the first gate electrode 46a' of the TFT may be made out of the same material and may be produced at the same time. If the thickness of the first capacitor electrode 143b is sufficiently thin to allow a dopant to pass through, the second active layer 142b and the first active layer 142a of the TFT may be simultaneously doped with the same dopant or with different dopants.

The light-emitting device includes a pixel electrode 50 made out of a transparent conductive material. The pixel electrode 50 may be formed in an opening H3 formed in the second insulating layer 47. The pixel electrode 50, the first source electrode 48a and the first drain electrode 49a of the TFT may be made out of the same material and may be produced at the same time.

If the display apparatus is an organic light emitting display apparatus, the light-emitting device is an organic light-emitting device (EL). Although not illustrated in FIG. 4, an organic layer including an emissive layer and a cathode may be formed on the pixel electrode 50 in the opening H3.

So far, top-gate type TFTs have been described as examples. However, embodiments of the present invention may also be applied to a bottom-gate type TFT, and thus its detailed description will be omitted.

The TFTs according to one or more embodiments of the present invention may be applied to various display apparatuses, such as an organic light emitting display apparatus, and a liquid crystal display (LCD) apparatus.

In addition, a single TFT and a single capacitor are illustrated for convenience of illustration however one or more embodiments of the present are not limited thereto, and a display apparatus according to one or more embodiments of the present invention may include a plurality of TFTs and a plurality of capacitors.

In a TFT according to one or more embodiments of the present invention, a metal wire corresponding to each of a source region and a drain region is formed on an active layer of a polysilicon thin film, and serves to reduce a contact resistance with the active layer while serving as an etch stop when contact holes are formed in an overlying insulating layer. An ohmic layer of the active layer includes doped regions at both ends of a channel region, and non-doped regions that are located below the metal wire and/or a region corresponding to a gate electrode. Thus, when the TFT according to one or more embodiment of the present invention is applied to various display apparatuses, a large-size display apparatus may be easily realized.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor (TFT), comprising:
   an active layer including a source region, a drain region, and a channel region, the active layer including a plurality of doped regions and at least one undoped region;
   a first metal member arranged on the active layer to correspond to a portion of each of the source region and the drain region, wherein the at least one undoped region includes a first portion of the active layer that corresponds to the first metal member;
   an upper insulating layer arranged on the first metal member, the upper insulating layer being perforated by a pair of contact holes that expose portions of the first metal member;
   a gate electrode arranged to correspond to the channel region of the active layer; and
   a second metal member to electrically connect each of the source region and the drain region to an external element.

2. The TFT of claim 1, wherein the at least one undoped region further includes a second portion of the active layer that corresponds to the gate electrode.

3. The TFT of claim 1, wherein the second metal member contacts the exposed portions of the first metal member, and wherein the second metal member fills and covers each of the contact holes.

4. The TFT of claim 1, wherein the first metal member comprises a material selected from a group consisting of molybdenum (Mo), titanium (Ti) and a Mo—Ti alloy.

5. The TFT of claim 1, wherein the first metal member comprises a same material as the second metal member.

6. The TFT of claim 1, wherein the active layer comprises polysilicon.

7. The TFT of claim 1, wherein the gate electrode comprises:
  a first gate electrode that includes a transparent conductive material; and
  a second gate electrode arranged on the first gate electrode.

8. An array substrate of a display apparatus comprising a thin film transistor (TFT), wherein the TFT comprises:
  a first active layer arranged on the array substrate, the first active layer including a source region, a drain region and a channel region, the first active layer includes a plurality of doped regions and at least one undoped region;
  a metal member arranged on the first active layer to correspond to each of the source region and the drain region, wherein the at least one undoped region includes a first portion of the first active layer that corresponds to the metal member;
  an upper insulating layer arranged on the metal member, the upper insulating layer being perforated by a pair of contact holes that exposes portions of the metal member;
  a gate electrode arranged to correspond to the channel region of the first active layer; and
  source and drain electrodes to electrically connect each of the source region and the drain region to an external element.

9. The array substrate of claim 8, wherein the at least one undoped region further includes a second portion of the first active layer that corresponds to the gate electrode.

10. The array substrate of claim 8, wherein each of the source and drain electrodes contacts a corresponding one of the exposed portions of the metal member, and wherein each of the source and drain electrodes fills and covers a corresponding one of the contact holes.

11. The array substrate of claim 8, wherein the metal member comprises a material selected from a group consisting of molybdenum (Mo), titanium (Ti) and a Mo—Ti alloy.

12. The array substrate of claim 8, wherein the metal member comprises a same material as the source and drain electrodes.

13. The array substrate of claim 8, wherein the active layer comprises polysilicon.

14. The array substrate of claim 8, wherein the gate electrode comprises:
  a first gate electrode including a transparent conductive material; and
  a second gate electrode arranged on the first gate electrode.

15. The array substrate of claim 14, further comprising a pixel electrode that includes a same material as the first gate electrode, the pixel electrode being arranged in a same layer level as the first gate electrode.

16. The array substrate of claim 14, further comprising a capacitor that includes:
  a second active layer arranged in a same layer level as the first active layer;
  a first electrode arranged on the second active layer and arranged in a same layer level as the metal member; and
  a second electrode arranged to face the first electrode, the second electrode including a same material as the first gate electrode.

17. The array substrate of claim 16, wherein the first electrode comprises a same material as the metal member.

18. The array substrate of claim 8, wherein the source and drain electrodes comprise:
  first source and drain electrodes that include a transparent conductive material; and
  second source and drain electrodes that are arranged on the first source and drain electrodes.

19. The array substrate of claim 18, further comprising a pixel electrode that includes a same material as the first source and drain electrodes.

* * * * *